(12) United States Patent
Uehara

(10) Patent No.: US 8,012,870 B2
(45) Date of Patent: Sep. 6, 2011

(54) WIRING STRUCTURE BETWEEN STEPS AND WIRING METHOD THEREOF

(75) Inventor: Noboru Uehara, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/620,882

(22) Filed: Nov. 18, 2009

(65) Prior Publication Data

US 2010/0127399 A1   May 27, 2010

(30) Foreign Application Priority Data

Nov. 27, 2008   (JP) ................................ 2008-302459

(51) Int. Cl.
*H01L 21/4763* (2006.01)

(52) U.S. Cl. . 438/618; 438/109; 257/773; 257/E23.141; 257/E21.575

(58) Field of Classification Search .................. 438/618, 438/109; 257/773, E23.14, E21.575
See application file for complete search history.

(56) References Cited

U.S. PATENT DOCUMENTS 7,454,831 B2   11/2008   Kurosawa et al.

FOREIGN PATENT DOCUMENTS

JP   2006-147650   6/2006

*Primary Examiner* — Long Pham
(74) *Attorney, Agent, or Firm* — Harness, Dickey & Pierce, P.L.C.

(57) ABSTRACT

In a wiring structure between steps in which a step portion is covered by an insulating slope formed by providing and drying droplets of an insulating ink in which an insulating material is dispersed in a dispersion medium and a wiring line formed by drying and firing provided droplets of a conductive ink in which a conductive material is dispersed in a dispersion medium is laid out between the steps and passes on a top surface of the insulating slope, the structure includes a liquid repellent layer formed of a liquid repellent material repelling the dispersion medium in the insulating ink, and a plurality of dot lines including a plurality of dots that is formed by hardening arranged droplets of a resin ink including a resin material. In the structure, the liquid repellent layer covers a surface including the step portion where the wiring line to be laid out. The droplets for forming the dot lines are arranged on a surface of the liquid repellent layer so as not to contact with each other in a region partitioned by a side serving as a start point and a side serving as an end point in a direction in which the wiring line is laid out. The insulating slope is formed by drying the droplets of the insulating ink provided to the step portion so as to connect the plurality of dot lines.

6 Claims, 5 Drawing Sheets

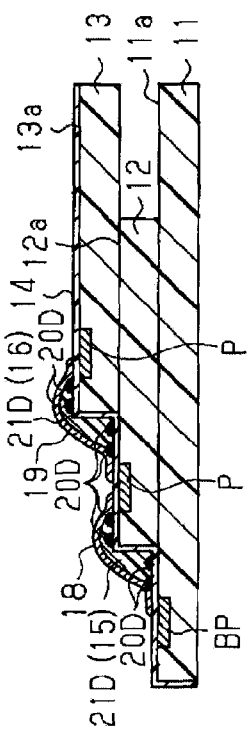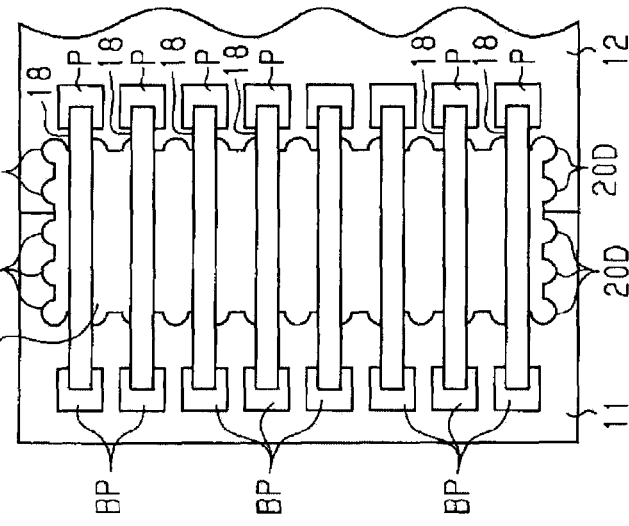
FIG. 6A
FIG. 6B
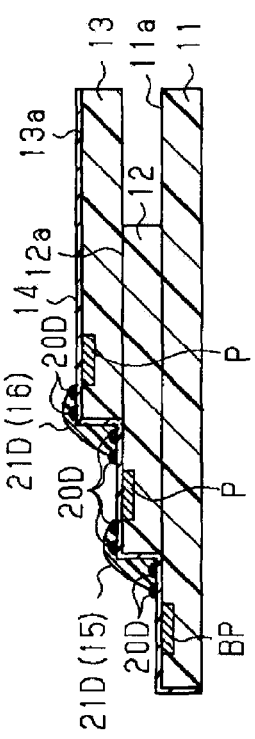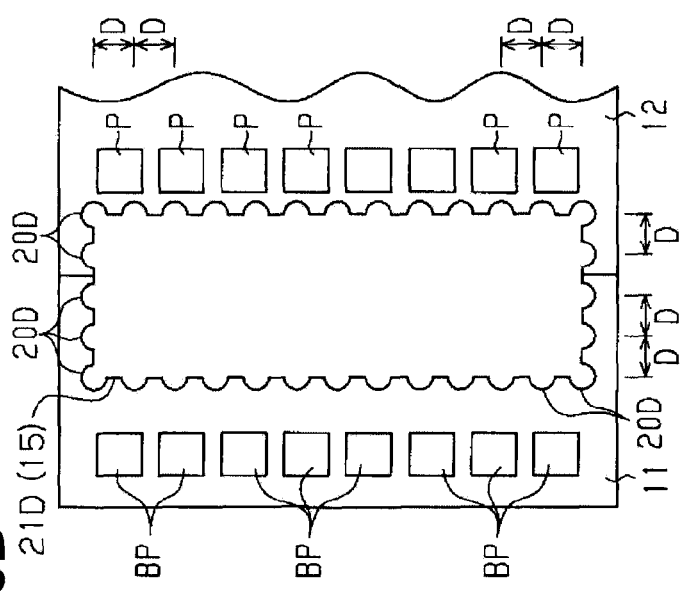
FIG. 7A
FIG. 7B

WIRING STRUCTURE BETWEEN STEPS AND WIRING METHOD THEREOF

BACKGROUND

1. Technical Field

The present invention relates to a wiring structure between steps and a wiring method thereof. The invention especially relates to a wiring structure in which a step portion between steps is wired in a state that the step portion is smoothly connected by an insulating slope. Such wiring between steps includes wiring between stacked electronic components and wiring lines intersecting with each other with a step on a plane surface. The invention also relates to an improvement of a wiring method in order to achieve the wiring structure.

2. Related Art

For example, when an electronic component, such as a semiconductor device (a package), is mounted on a substrate and the like, there are many cases in which what is called an inkjet method is used as a method for forming wiring lines coupled to electrode pads of the electronic component. In the inkjet method, a conductive ink including conductive fine particles dispersed therein is discharged as fine droplets and the droplets are dried. The inkjet method can drastically increase the degree of freedom of wiring structure as compared with a conventional wire bonding method because the shape of the wiring line can be changed in units of droplet. In addition, wiring in the air, which is provided in the wire bonding method, is not required, enabling space occupied by the wiring lines to be reduced. As a result, the mounting space of the electronic component can be reduced.

In a case where the wiring lines are formed on a pad forming surface of the electronic component with the pad forming surface up, a step corresponding to a thickness of the electronic component is formed between a mounting surface of the substrate and the like and the pad forming surface of the electronic component. The inkjet method enables the wiring lines to be formed along the step. However, the wiring lines formed along the step include bent portions as many as the number of steps, possibly impairing the mechanical reliability of the wiring lines. Therefore, if the step is included between the electrode pad, to which the wiring lines are coupled, and the wiring lines, in the inkjet method, a preprocessing for smoothly connecting the steps is usually performed so as to suppress the mechanical stress applied to the wiring lines.

To be specific, as disclosed in JP-A-2006-147650, an insulating resin material having high viscosity is discharged by a dispenser method so as to connect the pad forming surface of the electronic component and the mounting surface of the substrate and the like. Then, an insulating resin slope smoothly connecting the steps is formed. Sequentially, droplets composed of a conductive ink are discharged between the steps so as to pass on the insulating resin slope. The conductive ink is dried and fired so as to form the wiring lines. This mitigates the bend of the wiring lines, highly maintaining the mechanical and electrical reliability.

If the resin slope is formed by the dispenser method, the resin material discharged and provided from the dispenser has high viscosity. Such resin material makes it hard to avoid a time delay in the start and end of the discharge. Accordingly, it is not easy to provide the resin slope with high accuracy. In addition, the resin material having high viscosity causes the resin slope to thicken (increasing the height of the resin slope). As a result, a mounting space cannot be easily reduced.

Consequently, in recent years, the method for forming the resin slope by the ink jet method has been investigated. In the case of the ink jet method, discharged droplets have low viscosity. Therefore, a surface treatment is preliminarily performed on the pad forming surface, to which the droplet to be provided, so as to control a contact angle of the provided droplet. Specifically, as shown in FIGS. 8A to 8E, for example, as the surface treatment, a liquid repellent layer 43 is formed on a mounting surface 41a of a substrate 41 and pad forming surfaces 42a of electronic components 42 so as to evenly give high liquid affinity to these surfaces (FIG. 8A). The liquid repellent layer 43 is irradiated with ultraviolet rays L for controlling a contact angle of the droplet with respect to the liquid repellent layer 43 (FIG. 8B) so as to control the contact angle to be a predetermined value. After the surface treatment, a liquid layer 50L is formed by droplets in an amount to form the resin slope (FIGS. 8C and 8D). On a resin slope 50D, which is formed by drying the liquid layer 50L, wiring lines 48 are formed for coupling first electrode pads BP of the substrate 41 and second electrode pads P of the electronic component 42 (FIG. 8E). However, the surface treatment by irradiation with the ultraviolet rays L easily causes a variation in contact angle due to an influence of conditions including various elements such as surrounding environment, and also has a problem in achieving a surface treatment that realizes even contact angles. As a result, in the case of the inkjet method, the droplets provided for forming the resin slope 50D nonuniformly wet and spread on the liquid repellent layer 43. As shown in FIG. 8D, the end portions of a liquid layer 50L, which is formed by the droplets, are unevenly formed. That is, the droplets flow out from positions where the droplets supposed to be provided and move to surfaces of the electrode pads and the like, possibly causing connection failures.

SUMMARY

An advantage of the invention is to provide a wiring structure between steps and a wiring method thereof in which an insulating slope provided to smoothly connect a step portion of a wiring line between steps can be evenly formed by an inkjet method.

According to a first aspect of the invention, in a wiring structure between steps in which a step portion is covered by an insulating slope formed by providing and drying droplets of an insulating ink in which an insulating material is dispersed in a dispersion medium and a wiring line formed by drying and firing provided droplets of a conductive ink in which a conductive material is dispersed in a dispersion medium is laid out between the steps and passes on a top surface of the insulating slope, the structure includes a liquid repellent layer formed of a liquid repellent material repelling the dispersion medium in the insulating ink, and a plurality of dot lines including a plurality of dots that is formed by hardening arranged droplets of a resin ink including a resin material. In the structure, the liquid repellent layer covers a surface including the step portion where the wiring line to be laid out. The droplets for forming the dot lines are arranged on a surface of the liquid repellent layer so as not to contact with each other in a region partitioned by a side serving as a start point and a side serving as an end point in a direction in which the wiring line is laid out. The insulating slope is formed by drying the droplets of the insulating ink provided to the step portion so as to connect the plurality of dot lines.

According to the structure, the dot lines containing the resin material are arranged and formed so as not to contact with each other on the start point, the end point, and in the region between the start and end points including the step portion on the liquid repellent layer where the wiring lines to be laid out. The step portion includes the insulating slope formed by drying the droplets provided so as to connect the dot lines. Accordingly, even if the droplets for forming the insulating slope are provided on the liquid repellent layer, the provided droplets are drawn to the dot lines showing liquid repellency because the droplets and the dot lines have the same insulating material. Therefore, the provided droplets remain in the region partitioned by the dot lines. As a result, even if the inkjet method is employed, shapes of end portions of the insulating slope do not become uneven due to an influence of the droplets that easily wet and spread on the liquid repellent layer. The shapes of the end portions of the insulating slope are maintained in a desired shape by the arrangement of the dot lines. This enables the slope to be formed in a desired shape as a whole. If the steps are smoothly connected by the insulating slope having a desired shape, the wiring line passing on the insulating slope is preferably formed. As a result, the reliability of the wiring line between the steps can be automatically enhanced.

The droplets composed of the insulating ink discharged to the liquid repellent layer by the inkjet method for forming the insulating slope are drawn to the dot with which the droplets come into contact. This makes it possible to suppress the occurrence of disadvantages such as adhesion of the droplets to a surface of an electrode pad caused by inadvertent flow-out of the droplets. As a result, it is possible to reduce insulation failures between the electrode pad and the wiring line. In addition, it is possible to improve the reliability of electric connection of the wiring line using such insulating slope to the electrode pad.

In the wiring structure between steps, an interval between the dots adjacent to each other in each of the dot lines may be smaller than a landed diameter of each of the droplets of the insulating ink. According to the structure, the interval between the dots adjacent to each other is smaller than the landed diameter of the droplet of the insulating ink. Accordingly, even if the droplet landed between the dot lines moves from the landed position, the droplet comes into contact with any of the dots and is drawn to the dot with which the droplet comes into contact. As a result, even a single droplet can be suppressed from moving freely on the liquid repellent layer and adhering to the electrode pad.

In the wiring structure between steps, the resin ink may be composed of the same material as the insulating ink. According to the structure, the ink for forming the dot lines and the ink for forming the slope are composed of the same material. As a result, the dried dots even have liquid repellency with respect to the droplets composed of the same insulating ink, and the droplets are easily drawn to the dots. In addition, the droplets containing the same material come into contact with the interfaces of the dots, thereby the droplets and the dots have excellent affinity and the dried droplets (the insulating slope) and the dots have high adhesiveness.

In the wiring structure between steps, the wiring line may be laid out on a plurality of semiconductor chips stacked in a manner offsetting from each other. According to the structure, even in a case where the semiconductor chips are stacked in a manner offsetting from each other for higher integration, the wiring structure between steps can be applied.

According to a second aspect of the invention, a wiring method between steps in which a step portion is covered by an insulating slope formed by providing and drying droplets of an insulating ink in which an insulating material is dispersed in a dispersion medium and a wiring line formed by drying and firing provided droplets of a conductive ink in which a conductive material is dispersed in a dispersion medium is laid out between the steps and passes on a top surface of the insulating slope, the method includes covering a surface including the step portion where the wiring line to be laid out by a liquid repellent layer formed of a liquid material repelling the dispersion medium of the insulating ink, forming a plurality of dot lines including a plurality of dots by arranging a plurality of droplets of a resin ink including a resin material on a surface of the liquid repellent layer so as not to contact with each other in a region partitioned by a side serving as a start point and a side serving as an end point in a direction in which the wiring line is laid out, and by hardening the arranged droplets, and drying droplets of the insulating ink provided to the step portion so as to connect the dot lines. In the method, the wiring line between the steps is laid out so as to pass on a top surface of the insulating slope.

According to the method, the dot lines containing the resin material are arranged and formed so as not to contact with each other on the start point, the end point, and in the region between the start point and the end point including the step portion on the liquid repellent layer where the wiring lines to be laid out. The step portion includes the insulating slope formed by drying the droplets provided so as to connect the dot lines. Accordingly, even if the droplets for forming the insulating slope are provided on the liquid repellent layer, the provided droplets are drawn to the dot lines showing liquid repellency because the droplets and the dot lines have the same insulating material. Therefore, the provided droplets remain in the region partitioned by the dot lines. As a result, even if the inkjet method is employed, shapes of end portions of the insulating slope do not become uneven due to an influence of the droplets that easily wet and spread on the liquid repellent layer. The shapes of the end portions of the insulating slope are maintained in a desired shape by the arrangement of the dot lines. This enables the slope to be formed in a desired shape as a whole. If the steps are smoothly connected by the insulating slope having a desired shape, the wiring line passing on the insulating slope is preferably formed. As a result, the reliability of the wiring line between the steps can be automatically enhanced.

The droplets composed of the insulating ink discharged to the liquid repellent layer by the inkjet method for forming the insulating slope are drawn to the dot with which the droplets come into contact. This makes it possible to suppress the occurrence of disadvantages such as adhesion of the droplets to a surface of an electrode pad caused by inadvertent flow-out of the droplets. As a result, it is possible to reduce insulation failures between the electrode pad and the wiring line. In addition, it is possible to improve the reliability of electric connection of the wiring line using such insulating slope to the electrode pad.

In the wiring method between steps, an interval between the dots adjacent to each other in each of the dot lines may be smaller than a landed diameter of each of the droplets of the insulating ink. According to the method, the interval between the dots adjacent to each other is smaller than the landed diameter of the droplet of the insulating ink. Accordingly, even if the droplet landed between the dot lines moves from the landed position, the droplet comes into contact with any of the dots and is drawn to the dot with which the droplet comes into contact. As a result, even a single droplet can be suppressed from moving freely on the liquid repellent layer and adhering to the electrode pad.

In the wiring method between steps, the insulating ink may be provided by continuously discharging the droplets in an amount necessary to form a height of the insulating slope.

According to the method, the droplets of the insulating ink in an amount necessary to form a height of the insulating slope is provided by continuously discharging the droplets to a predetermined position. For example, in a case where the droplets are decentrally provided on the dots, a number of liquid accumulations are generated that are independent and do not spread until the liquid accumulations become a predetermined size. In order to link the liquid accumulations, more droplets are required to be supplied. However, according to the method, a single liquid layer is formed by the continuous discharge of the droplets so as not to generate the plurality of liquid accumulations. In this way, it is possible to reduce the amount of the droplet to be supplied. This allows more freedom in controlling the supply amount of the droplet. Since the height of the slope is controlled by the supply amount of the droplet, selectivity of the height can be enhanced.

The wiring method between steps may further include performing a liquid affinity treatment to each of the dot lines so as to control a contact angle of the insulating ink with respect to the dot line prior to drying the provided droplets of the insulating ink.

According to the method, the liquid affinity treatment such as irradiating the dot line with ultraviolet rays or plasma is performed. In this way, the wettability (liquid repellency) of the dot line is increased so as to control a contact angle of the droplet with respect to the dot. This enables the droplet drawn to the dot line to be easily wet and spread with respect to the dot. As a result, the liquid layer can be widely formed without providing a number of droplets thereto. That is, enhancing the wettability enabling the height of the insulating slope to be controlled low.

In the wiring method between steps, the resin ink may be composed of the same material as the insulating ink. According to the method, the ink for forming the dot lines and the ink for forming the slope are composed of the same material. As a result, the dried dots even have liquid repellency with respect to the droplets composed of the same insulating ink, and the droplets are easily drawn to the dots. In addition, the droplets containing the same material come into contact with the interfaces of the dots, thereby the droplets and the dots have excellent affinity and the dried droplets (the insulating slope) and the dots have high adhesiveness.

In the wiring method between steps, the wiring line may be laid out on a plurality of semiconductor chips stacked in a manner offsetting from each other. According to the method, even in a case where the semiconductor chips are stacked in a manner offsetting from each other for higher integration, the wiring method between steps can be applied.

BRIEF DESCRIPTION OF THE DRAWINGS

The invention will be described with reference to the accompanying drawings, wherein like numbers reference like elements.

FIG. 4A is a sectional view while FIG. 4B is a partial plane view.

FIGS. 6A and 6B are diagrams showing a state in the manufacturing process of the wiring structure between steps. FIG. 6A is a sectional view while FIG. 6B is a partial plane view.

FIGS. 7A and 7B are diagrams showing a state in the manufacturing process of the wiring structure between steps. FIG. 7A is a sectional view while FIG. 7B is a partial plane view.

FIGS. 8A to 8C are sectional views while FIGS. 8D and 8E are plan views.

DESCRIPTION OF EXEMPLARY EMBODIMENT

Figure 1:
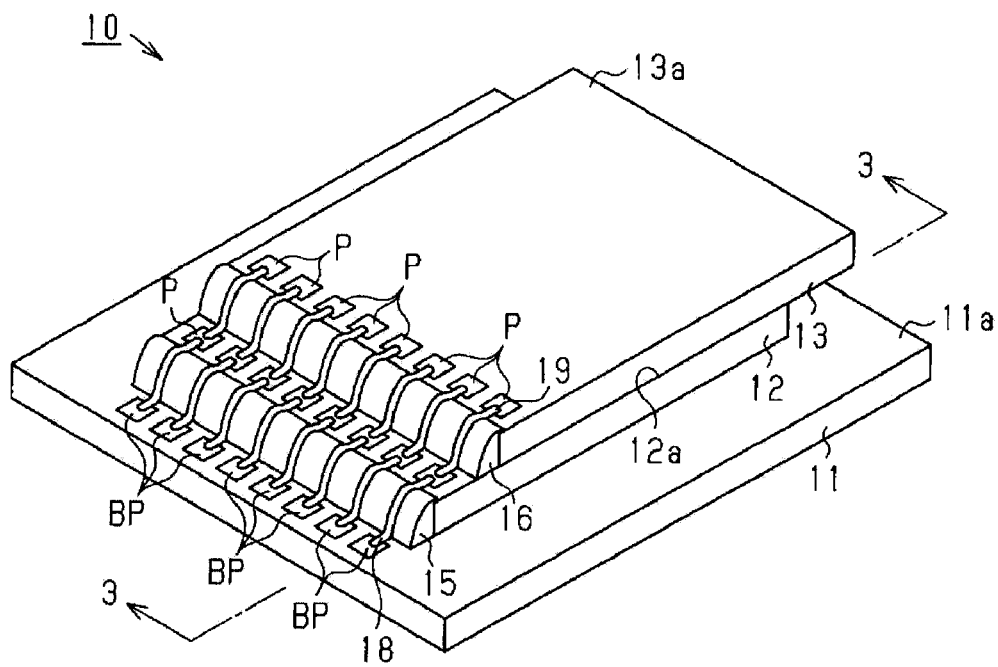
FIG. 1 is a perspective view showing an embodiment of an electronic apparatus having a wiring structure between steps.

An embodiment of the invention will be described with reference to FIG. 1. In the embodiment, a wiring structure between steps according to the invention is embodied and included in an electronic apparatus. FIG. 1 is a perspective view showing a structure of an electronic apparatus 10. As shown in FIG. 1, the electronic apparatus 10 includes a mounting substrate 11, a first semiconductor chip 12 serving as an electronic component stacked on the mounting substrate 11, a second semiconductor chip 13 serving as an electronic component stacked on the first semiconductor chip 12.

The mounting substrate 11 is a multilayer substrate having a rectangular shape when viewed from its vertical direction, which is a thickness direction of the mounting substrate 11. On the top layer of the mounting substrate 11, an insulating substrate (not shown) having an insulating property is stacked. On the top surface of the insulating substrate, i.e., a mounting surface 11a serving as the top surface of the mounting substrate 11, first electrode pads BP, having a rectangular shape when viewed from the above, are arranged along one side of the mounting surface 11a. Each of the first electrode pads BP is made of a conductive metal material and electrically coupled to each electronic element and the like provided on the mounting substrate 11 via a wiring line.

The insulating substrate (the top layer of the mounting substrate 11) can be made of flexible or non-flexible various insulating materials. Examples of such flexible materials include synthetic resin such as polyimide resin, epoxy resin, polyester resin, phenol resin, and fluorine resin. Further, examples of such non-flexible materials include a high temperature fired base material and a dielectric material in addition to glass ceramic, which is a low temperature fired base material.

Besides the first electrode pads BP, the above-described mounting substrate 11 may include various wiring lines on the mounting surface 11a. The mounting substrate 11 may be a multilayer substrate having a plurality of circuit boards on which various wiring lines are printed as long as the first electrode pads BP are formed on the mounting surface 11a.

On the mounting surface 11a, the first semiconductor chip (a first chip) 12 is bonded with a bonding layer (not shown) interposed therebetween so as not to cover the first electrode pads BP. The first chip 12 has a rectangular plate shape when viewed form the above. On a first pad forming surface 12a, which is the top surface of the first chip 12, a plurality of second electrode pads P, having a rectangular shape when viewed from the above, is arranged along one side of the first chip 12 in a manner corresponding to each first electrode pad BP of the mounting substrate. Each of the second electrode pads P is made of a conductive metal material and electrically coupled to each electronic element and the like provided on the first chip 12 via a wiring line. On the first pad forming surface 12a, an insulating layer (not shown) is formed in a manner exposing the second electrode pads P. The insulating layer is a thin film made of an insulating material such as an inorganic insulating material or an organic insulating material. As the inorganic insulating material, $SiO_2$, SiN or the like can be used. As the organic insulating material, polyimide resin or the like can be used.

On the first pad forming surface 12a of the first chip 12, the second semiconductor chip (a second chip) 13 is bonded with a bonding layer (not shown) interposed therebetween so as not to cover the second electrode pads P. The second chip 13 is the same semiconductor chip as the first chip 12, and has a rectangular plate shape when viewed form the above. On a second pad forming surface 13a, which is the top surface of the second chip 13, the plurality of second electrode pads P, having a rectangular shape when viewed from the above, is arranged along one side of the second chip 13 in a manner corresponding to each second electrode pad P of the first chip 12. Similarly to the second electrode pad P on the first chip 12, each of the second electrode pads P on the second chip 13 is made of a conductive metal material and electrically coupled to each electronic element and the like provided on the second chip 13 via a wiring line. Further, on the second pad forming surface 13a, the insulating layer (not shown) is also formed in a manner exposing the second electrode pads P. Similarly to the insulating layer on the first chip 12, the insulating layer on the second pad forming surface 13a is a thin film made of an inorganic insulating material or an organic insulating material. The inorganic insulating material or the organic insulating material described above can be used.

A step corresponding to a thickness of the first chip 12 is formed between the mounting surface 11a and the first pad forming surface 12a. The side of the first chip 12, facing the first electrode pads BP, has a continuous surface connecting the mounting surface 11a and the first pad forming surface 12a so as to form a first slope 15. The first slope 15 is an inclined portion so that the continuous surface smoothly connects the steps. The first slope 15 is formed of an insulating material. As such insulating material, thermosetting resin such as epoxy resin, light curing resin such as acrylic resin, or a mixture of these can be used. On a surface of the first slope 15, first metal wiring lines 18 are formed that respectively and electrically couple the first and second electrode pads BP and P.

A step corresponding to a thickness of the second chip 13 is formed between the first pad forming surface 12a and the second pad forming surface 13a. The side of the first pad forming surface 12a, facing the second electrode pads P, has a continuous surface connecting the first pad forming surface 12a and the second pad forming surface 13a so as to form a second slope 16. The second slope 16 is an inclined portion so that the continuous surface smoothly connects the steps. Similarly to the first slope 15, the second slope 16 is formed of the insulating material. On a surface of the second slope 16, second metal wiring lines 19 are formed that respectively and electrically couple the second electrode pads P of the first chip 12 and the second electrode pads P of the second chip 13.

That is, in the electronic apparatus 10, the step between the mounting surface 11a and the first pad forming surface 12a is smoothly connected by the first slope 15 while the step between the first pad forming surface 12a and the second pad forming surface 13a is smoothly connected by the second slope 16. Accordingly, the first electrode pads BP of the mounting substrate 11 are respectively coupled to the second electrode pads P of the first chip 12 with the first metal wiring lines 18, which have high mechanical reliability since the mechanical reliability is not degraded by being bent at the step, and are provided so as to pass on the first slope 15. Additionally, the second electrode pads P of the first chip 12 are respectively coupled to the second electrode pads P with the second metal wiring lines 19, which have high mechanical reliability since the mechanical reliability is not degraded by being bent at the step, and are provided so as to pass on the second slope 16.

Figure 2:
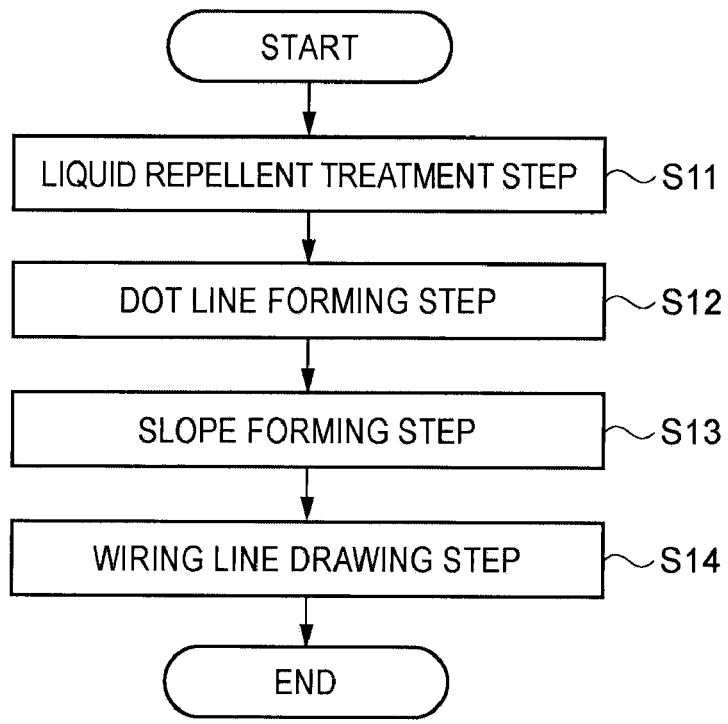
FIG. 2 is a flowchart showing a manufacturing process in a method for forming a wiring line between steps.
Figure 3A:
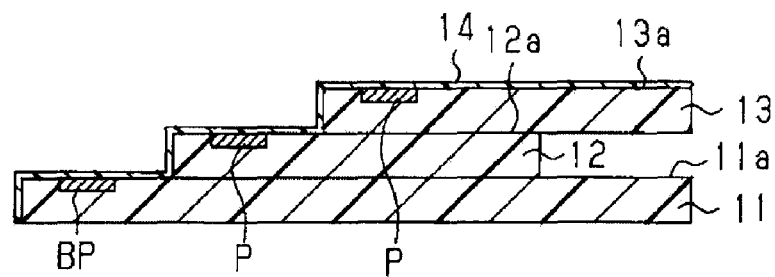
FIGS. 3A and 3B are sectional views along line 3-3 of FIG. 1 in the manufacturing process of a wiring structure between steps.
Figure 3B:
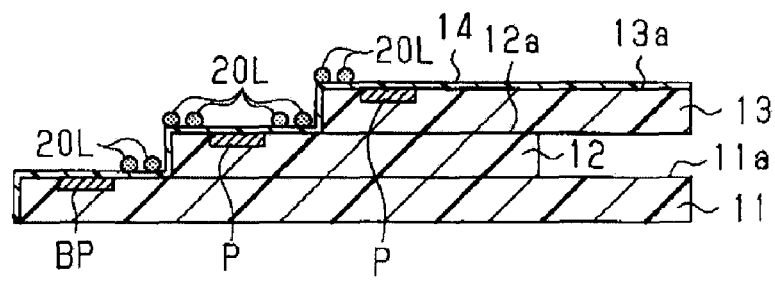
Figure 5A:
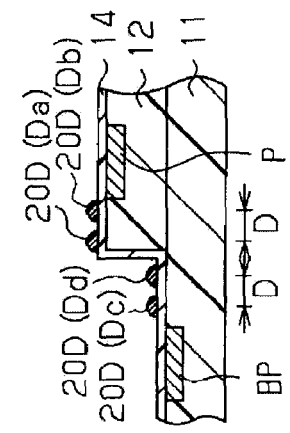
FIGS. 5A to 5C are sectional views showing a state in the manufacturing process of the wiring structure between steps.
Figure 5B:
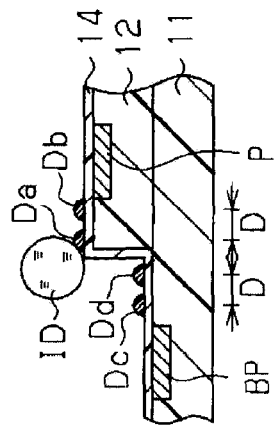
Figure 5C:
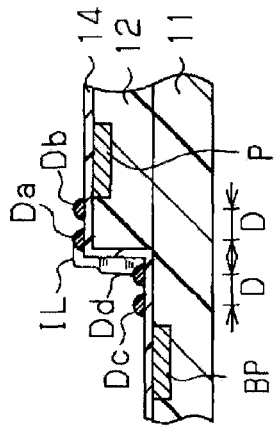
Figure 4A:
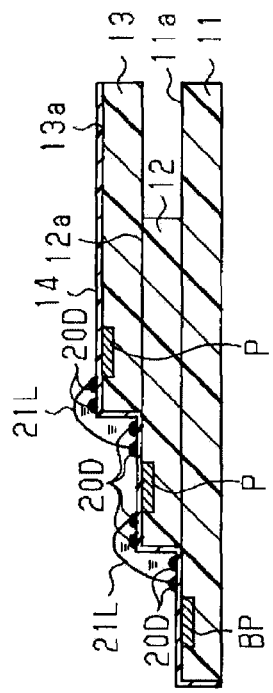
FIGS. 4A and 4B are diagrams showing a state in the manufacturing process of the wiring structure between steps.
Figure 4B:
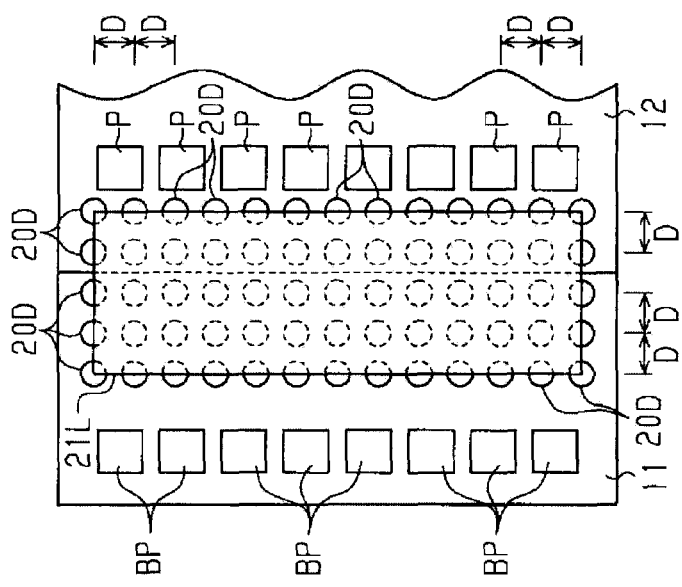
Figure 8A:
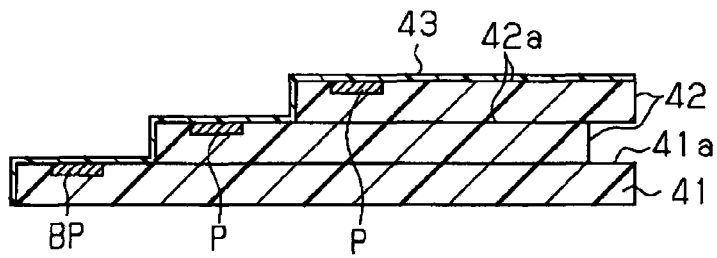
FIGS. 8A to 8E are diagrams showing a manufacturing process of conventional method for forming a wiring line between steps.
Figure 8B:
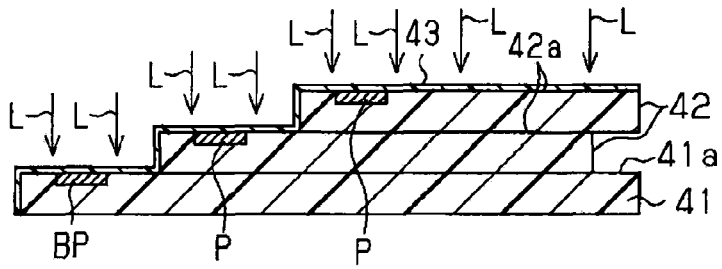
Figure 8C:
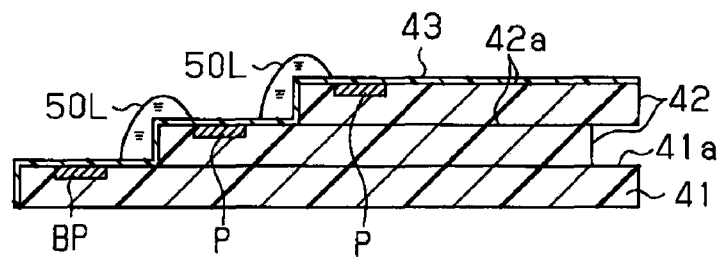
Figure 8D:
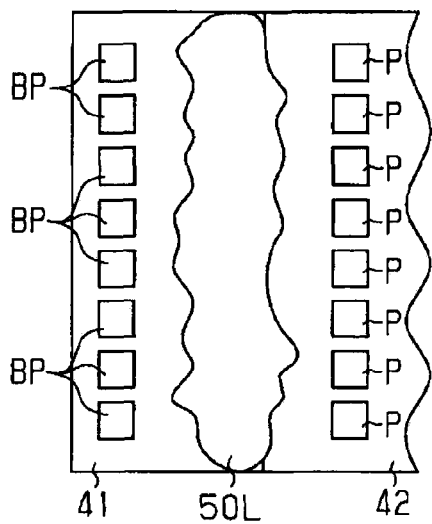
Figure 8E:
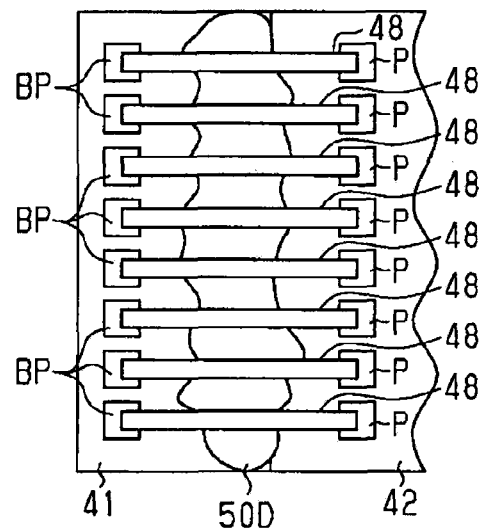

A method for forming a wiring line between steps of the electronic apparatus 10 will be described with reference to FIGS. 2 to 7B. FIG. 2 is a flowchart showing a manufacturing process in the method for forming a wiring line between steps. FIGS. 3A and 3B are diagrams showing sectional structures along line 3-3 of FIG. 1 in the manufacturing process. FIGS. 4A and 4B are diagrams showing a state in which a slope is formed in the manufacturing process. FIG. 4A shows a sectional structure while FIG. 4B shows a partial plane structure. FIGS. 5A, 5B, and 5C are sectional views showing a state in which a droplet is wet and spread when the slope is formed. FIGS. 6A and 6B also are diagrams showing a state in which the slope is formed in the manufacturing process. FIG. 6A shows a sectional structure while FIG. 6B shows a partial plane structure. FIGS. 7A and 7B are diagrams showing a state in which a wiring line is formed in the manufacturing process. FIG. 7A shows a sectional structure while FIG. 7B shows a partial plane structure.

Referring to FIG. 2, the manufacturing process for forming wiring between steps sequentially includes a liquid repellent treatment step (step S11), a dot line forming step (step S12), a slope forming step (step S13), and a wiring line drawing step (step S14).

As shown in FIG. 3A, in the liquid repellent treatment step, a liquid repellent layer 14 is formed on the top surface of the electronic apparatus 10. To be specific, the liquid repellent layer 14 is formed by drying droplets provided by an inkjet method on the mounting surface 11a, the first pad forming surface 12a, and the second pad forming surface 13a. The droplets are composed of a liquid repellent ink containing a liquid repellent material. In the present embodiment, the liquid repellent layer 14 can be formed as a monomolecular film or a resin film. Examples of the liquid repellent material includes fluorine resin or the like that exhibits liquid affinity with respect to a dispersion medium of an insulating ink described below.

For example, the liquid repellent material forms a self-assembled film made of organic molecular film and the like on the mounting surface 11a, the first pad forming surface 12a, and the second pad forming surface 13a. The organic molecular film includes a functional group capable of combining with the surfaces of the mounting surface 11a and the like at one end, and a functional group exhibiting liquid repellency at the other end. The organic molecular film also includes a linear or partially branched carbon chain that joins the functional groups together. Accordingly, the organic molecular film combines with the mounting surface 11a and the like so as to be self-assembled, forming a molecular film such as a monomolecular film.

The self-assembled film is a film formed by orienting a compound composed of a bonding functional group that can react with constituent atoms of an underlying layer (e.g. the mounting surface 11a and the like) and other linear chain molecules. The compound has extremely high orientation by interactions of the linear chain molecules. Since the self-assembled film is formed by orientating monomolecules, the film can be formed with extremely thin thickness and evenly at a molecular level. In other words, since identical molecules are formed on the film surface, it is possible to provide excellent liquid repellency and the like evenly to the film surface.

For example, in a case where fluoroalkylsilane is used as the above-mentioned compound having high orientation, each compound is orientated such that the fluoroalkyl group is disposed on the film surface to form a self-assembled film. As a result, liquid repellency is evenly provided to the film surface.

Examples of the compound forming the self assembled film include fluoroalkylsilane (hereinafter referred to as "FAS") such as heptadecafluoro-1,1,2,2-tetrahydrodecyl-triethoxysilane, heptadecafluoro-1,1,2,2-tetrahydrodecyl-trimethoxysilane, heptadecafluoro-1,1,2,2-tetrahydrodecyl-trichlorosilane, tridecafluoro-1,1,2,2-tetrahydrooctyl-triethoxysilane, tridecafluoro-1,1,2,2-tetrahydrooctyl-trimethoxysilane, tridecafluoro-1,1,2,2-tetrahydrooctyl-trichlorosilane, and trifluoropropyl trimethoxysilane. One of these compounds may be used alone, or alternatively two or more of them may be used in combination.

As shown in FIG. 3B, in the dot line forming step, dot lines are formed by providing droplets 20L in a slope forming region in which the slope to be formed. The slope is formed between the mounting surface 11a and the first pad forming surface 12a as well as between the first pad forming surface 12a and the second pad forming surface 13a. To be specific, between the first electrode pad BP of the mounting surface 11a and the second electrode pad P of the first pad forming surface 12a, the slope forming region is partitioned in which the first slope 15 to be formed. The first slope 15 connects the mounting surface 11a, which includes the step corresponding to the thickness of the first chip 12, and the first pad forming surface 12a with the continuous surface. The slope forming region is partitioned by a side of the mounting surface 11a, serving as a start point, and a side of the first pad forming region 12a, serving as an end point. The droplets 20L, composed of an insulating ink in which the above-described insulating material is dispersed in a dispersion medium, are arranged by the inkjet method to the side serving as the start point, the side serving as the end point, and a region between the sides.

Similarly, between the second electrode pad P of the first pad forming surface 12a and the second electrode pad P of the second pad forming surface 13a, the slope forming region is partitioned in which the second slope 16 to be formed. The second slope 16 connects the first pad forming surface 12a, which includes the step corresponding to the thickness of the second chip 13, and the second pad forming surface 13a with the continuous surface. The slope forming region is partitioned by a side of the first pad forming surface 12a, serving as a start point, and a side of the second pad forming region 13a, serving as an end point. The droplets 20L, composed of the insulating ink, are arranged by the inkjet method on the side serving as the start point, the side serving as the end point, and in a region between the sides.

The droplets 20L arranged in each slope forming region are provided so as not to come into contact with each other. The droplets 20L provided in this manner are dried, forming a plurality of dot lines that include a plurality of dots 20D arranged on the liquid repellent layer 14 (refer to FIG. 4A). In the embodiment, an interval between the dots 20 adjacent to each other has a predetermined interval D (refer to FIG. 4B). Here, the interval D is smaller than a diameter of each of the droplets 20L landed on the liquid repellent layer 14, and is 10 μm to 12 μm, for example. The value of the interval D can be arbitrarily changed in accordance with the landed diameter, types of droplets, landing accuracy, or the like.

As described above, the liquid repellent layer 14 is formed on the top surface of the electronic apparatus 10 to which the droplets of the insulating ink are provided. Though the droplets provided on the liquid repellent layer 14 hardly wet and spread thereon, the droplets easily move on the liquid repellent layer 14. If the interval between the droplets 20L is small, the adjacent droplets come into contact with each other, so that a number of liquid accumulations are randomly formed. Thus, it is hard to arrange the droplets 20L in a predetermined manner. However, in the embodiment, the droplets 20L are provided so as not to come into contact with each other. Accordingly, each droplet 20L remains at a landed position as long as an external force is applied to the liquid repellent layer 14. By drying the droplets 20L, the slope forming region is adequately partitioned by the dots 20D.

In the slope forming step, droplets composed of the insulating ink are provided to the dot lines partitioning the slope forming region and dried so as to form the first and second slopes 15 and 16. To be specific, if the dot lines including the arrangement of the dots 20D are formed on the liquid repellent layer 14, the droplets of the insulating ink, in a predetermined amount, is continuously provided on the dot lines by the inkjet method so as to form the slope having a predetermined thickness. At this time, the droplet is repelled by the liquid repellent layer 14 while having liquid repellency to the dot 20D which is formed by drying the insulating ink. This allows the droplet provided at this time to be drawn to the dot 20D by coming into contacting with the dot 20D. As a result, the droplet is detained in a region in which the droplet can come into contact with the dot 20D, i.e., the slope forming region. In the embodiment, since the interval D between the dots 20D is smaller than the diameter of the droplet landed on the liquid repellent layer 14, the droplet does not flow out from the slope forming region through the dots 20D even if the provided droplet does not come into contact with the dot 20D. In a case where the droplet flows out from the slope forming region, the flowed droplet eventually form a liquid layer 21L, which comes into contact with the dots 20D, together with other droplets.

The slope forming region straddling the mounting substrate 11 and the first chip 12 has a step formed therein (FIG. 5A). To the step included in the slope forming region, the droplet of the insulating ink is also provided. At this time, as shown in FIG. 5B, a droplet ID is provided between a dot Da and a dot Dd. The dot Da is provided on the upper step of the first chip 12 while the dot Dd is provided on the lower step of the mounting substrate 11. One end of the droplet ID wets and spreads on the contacted dot Da while the other end drops down to the lower step so as to extend. The other end of the droplet ID wets and spreads on the dot Dd with which the droplet ID comes into contact after landed on the mounting substrate 11. As FIG. 5C shows, a tie layer IL, which is a liquid accumulation of the droplet ID straddling the step, is formed in a manner such that one end thereof wets and spreads on the dot Da while the other end wets and spreads on the dot Dd. Even if the single droplet ID is not big enough to straddle the step for connecting the dot Da and the dot Dd, a plurality of droplets ID are continuously supplied to the vicinity of the step so as to combine with each other. Then, the plurality of droplets ID wet and spread on the dot Da while flowing to the dot Dd. In this way, the above-described tie layer IL can be formed. The tie layers IL formed between each dot Da and each dot Dd are linked by the droplets ID and the like provided between the tie layers IL, forming the tie layer covering the step in the slope forming region. At the same time, the tie layers IL combine with other tie layers (not shown) that wet and spread between the dot Dd and a dot Dc of the lower step as well as between the dot Da and a dot Db of the upper step. The droplets are supplied there by a predetermined amount so as to thickly cover the step. Accordingly, the liquid layer 21L is formed that is raised by surface tension so as not to spread outside the slope forming region. Further, similarly to the above-described step between the mounting substrate 11 and the first chip 12, the step in the slope forming region straddling the first chip 12 and the second chip 13 has the tie layer so as to connect each dot 20D in the upper step and the lower step. The tie layer combines with other tie layers and the like so as to cover the step and form the liquid layer 21L by the droplets supplied by the predetermined amount.

In the slope forming region straddling the mounting surface 11a and the first pad forming surface 12a, the liquid layer 21L is formed that straddles each dot 20D on the mounting surface 11a and each dot 20D on the first pad forming surface 12a. Further, the liquid layer 21 has a height exceeding the height of the first chip 12a.

As shown in FIGS. 6A and 6B, the liquid layer 21L formed in the slope forming region is dried so as to form a solid layer 21D. At this time, as shown in FIG. 6A, the solid layer 21 covers most of the dots 20D except for ones positioned at the sides serving as the start and end points of the slope forming region. On the other hand, as FIG. 6B shows, a part of each the dot 20D positioned at the sides serving as the start and end points of the slope forming region remains a semicircular shape outside the solid layer 21D. End portions of the solid layer 21D and circular arcs of the dots 20D in a semicircular shape form a wave-like shape. In general, the liquid layer 21L receives a force drawing it to a position where a distance between two dots 20D with which the liquid layer 21L comes into contact is the shortest, and at the side portion of the slope forming region, the liquid layer 21L receives a force drawing it to a center direction by the droplets at the center direction. Therefore, the part of each dot 20D is not covered by the liquid layer 21L. Accordingly, the part of each dot 20D also remain in the solid layer 21D formed by drying the liquid layer 21L exposing the part of the dot 20D at the side portion. The solid layers 21D formed in this manner respectively serve as the first and second slopes 15 and 16. That is, the first and second slopes 15 and 16 have evenly formed end portions. Accordingly, even inclined surfaces are formed on the slopes 15 and 16.

In the embodiment, the dots 20D and the slopes are formed of the droplets composed of the same insulating ink. Therefore, when the liquid layer 21L is provided to each dot 20D, the interface of the dot 20D affixes to the liquid layer 21L well. Accordingly, when the liquid layer 21L is dried, the solid layer 21D is preferably fused to each dot 20D, that is, the first and second slopes 15 and 16 are evenly formed in the respective slope forming regions.

In the wiring line drawing step, the first and second metal wiring lines 18 and 19 are formed. That is, as shown in FIGS. 7A and 7B, after the first and the second slopes 15 and 16 are formed, the first metal wiring lines 18 are formed that connect the steps and pass on the first slope 15, and the second wiring lines 19 are formed that connect the steps and pass on the second slope 16. The first and second wiring lines 18 and 19 are formed by the inkjet method using a conductive ink composed of dispersion system of conductive fine particles serving as a conductive material. In the embodiment, droplets composed of the conductive ink are continuously discharged and provided to each position from the top surface of the first electrode pads BT of the mounting surface 11a to the second electrode pads P on the first pad forming surface 12a through the first slope 15. Sequentially, by performing a heat treatment to the provided droplets, evaporation of the dispersion medium and firing of the conductive fine particles are advanced. At the same time, the conductive fine particles, the first electrode pads BP, and the second electrode pads P break the liquid repellent layer 14 and physically combine with each other. In this way, the first metal wiring lines 18 are formed. In addition, the droplets composed of the conductive ink are continuously discharged and provided to each position from the top surface of the second electrode pads P of the first pad forming surface 12a to the second electrode pads P on the second pad forming surface 13a through the second slope 16. Sequentially, by performing a heat treatment to the provided droplets, evaporation of the dispersion medium and firing of the conductive fine particles are advanced. At the same time, the conductive fine particles and the respective second electrode pads P break the liquid repellent layer 14 and physically combine with each other. In this way, the second metal wiring lines 19 are formed.

In the embodiment, surfaces of the first and second slopes 15 and 16 have an even inclined surface formed thereon. This makes it possible to suppress an unconsidered movement of the droplet of the conductive ink provided on the inclined surface, enabling a wiring pattern to be evenly drawn. Since the wiring pattern to be drawn is even, it is possible to reduce distortion and disconnection of formed wiring lines as well as contact of the wiring lines adjacent to each other. As a result, stability of the wiring lines is mechanically and electrically improved.

Here, the conductive fine particles of the conductive ink have a particle diameter of several nanometers to several tens of nanometers, and can be made of a metal such as gold, silver, copper, platinum, palladium, rhodium, osmium, ruthenium, iridium, iron, tin, cobalt, nickel, chromium, titanium, tantalum, tungsten, and indium, or their alloys.

On the other hand, any dispersion medium can be used that is capable of dispersing the conductive fine particles and does not cause an aggregation. Examples of the dispersion medium includes: water; alcohols such as methanol, ethanol, propanol, and butanol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis (2-methoxyethyl)ether, and p-dioxane; and polar compounds such as propylene carbonate, gamma-butyrolactone, N-methyl-2-pyrrolidone, dimethylformamide, dimethyl sulfoxide, and cyclohexanone. Among them, water, alcohols, hydrocarbon compounds, and ether compounds are preferably used in terms of the dispersibility of conductive particles, stability of dispersion-liquid, and applicability to a droplet discharge method. Water and hydrocarbon compounds can be exemplified as a more preferable dispersion medium.

In a case where a wire bonding method is used for coupling the electrode pads on the mounting surface 11a and the electrode pads on the first pad forming surface 12a as well as the electrode pads on the first pad forming surface 12a and the electrode pads on the second pad forming surface 13a, the mounting substrate 11, the first chip 12, and the second chip 13 are heated to an elevated temperature or large mechanical stress is locally applied. Therefore, in the case of using the wire bonding method, heat resistance and durability against the mechanical stress is highly demanded for the mounting substrate 11, the first chip 12, and the second chip 13. However, if the first and second metal wiring lines 18 and 19 are formed by a droplet discharge method as the embodiment, it is possible to reduce the above-described demands for the mounting substrate 11, the first chip 12, and the second chip 13. This allows more freedom in selecting materials for the mounting substrate 11, the first chip 12, and the second chip 13.

As described in the above mentioned embodiment, the following effects can be obtained according to the wiring structure between steps. On the liquid repellent layer 14, the dot lines including the dots 20D containing a resin material are respectively arranged and formed so as not to contact with each other on the start points, the end points, and between the start and end points, of the regions in which the first and the second wiring lines 18 and 19 to be laid. Then, the droplets provided so as to connect the dot lines are dried so as to form the first and second slopes 15 and 16, serving as an insulating slope, at the respective step portions. Accordingly, in a case where the droplets for forming the first and second slopes 15 and 16 (the liquid layer 21L) are provided on the liquid repellent layer 14, the droplets (the liquid layer 21) are drawn to the dots 20D having liquid repellency because both of the droplets and the dots 20D contain the same of insulting material. Thus, the droplets remain in the slope forming region partitioned by the dot lines composed of the arrangement of each dot 20D. Even if the inkjet method is employed, the shapes of the end portions of the insulating slopes do not become uneven due to an influence of the droplets that easily wet and spread on the liquid repellent layer 14. The shapes of the end portions of the first and second slopes 15 and 16 are maintained in a desired shape by the arrangement of the dot lines. This enables the first and second slopes 15 and 16 to be formed in a desired shape as a whole. The first and second slopes having a desired shape smoothly connect the steps. As a result, the first and second metal wiring lines 18 and 19, passing on the first and second slopes 15 and 16, are preferably formed, automatically enhancing the reliability of the wiring lines between the steps.

The droplet composed of the insulating ink discharged to the liquid repellent layer 14 for forming the first and second slopes 15 and 16 by the ink jet method is drawn to the dot 20D with which the droplet comes into contact. This makes it possible to suppress the occurrence of disadvantages such as adhesion of the droplet to the surfaces of the first and second electrode pads BP and P caused by inadvertent flow-out of the droplets. Accordingly, it is possible to reduce insulation failures between the first and second electrode pads BP and P and the first and second metal wiring lines 18 and 19 coupled to the electrode pads BP and P. In addition, it is possible to improve the reliability of electric connection of the wiring line using such insulating slope to the electrode pad.

The interval D, which is an interval between the dots 20D adjacent to each other, is smaller than the diameter of the landed droplet 20L composed of the insulating ink. Even if the droplet landed between the dot lines moves from the landed position, the droplet comes into contact with any of the dots 20D, and drawn to the contacted dot 20D. As a result, even a single droplet can be suppressed from moving freely on the liquid repellent layer 14 and adhering to the first electrode pad BP or the second electrode pad P.

The same insulating ink is employed for the ink for forming the dot 20D and the ink for forming the first and second slopes 15 and 16. As a result, the dried dot 20D even has liquid repellency with respect to the droplet composed of the same insulating ink, and the droplet is easily drawn to the dot. Further, the droplet containing the same material comes into contact with the interface of the dot 20D, thereby the dot 20D and the droplet (the liquid layer 21L) have excellent affinity, and the solid layer 21D (the first and second slopes 15 and 16), which is the droplet after being dried, and the dot 20D have high adhesiveness.

The liquid layer 21L is formed by continuously discharging the droplets composed of the insulating ink in an amount necessary to form a height of each of the first and second slopes 15 and 16. For example, in a case where the droplets are decentrally provided on the dots 20, a number of liquid accumulations are generated that are independent and do not spread until the liquid accumulations become a predetermined size. In order to link the liquid accumulations, more droplets are required to be supplied. However, according to the embodiment, the single liquid layer 21L is formed by the continuous discharge so as not to generate the plurality of liquid accumulations. In this way, it is possible to reduce the amount of the droplet to be supplied. This allows more freedom in controlling the supply amount of the droplet. Since the heights of the first and second slopes 15 and 16 are controlled by the supply amount of the droplet, selectivity of the height can be enhanced.

The dots 20D are formed on the upper side of each step portion so as to form the first and second slopes 15 and 16 thereon. As a result, even if a conductor, such as guard rings, wiring layers, or scribe lines, is provided to the periphery of the first and second chip 12 and 13, the first and second metal wiring lines 18 and 19 can be formed that pass over the conductor while maintaining an insulation property with respect to the conductor.

The above embodiment may be changed as follows. In the embodiment, the step portions are formed by the first chip 12 and the second chip 13. The step portions may be formed by other components or wiring lines. For example, the wiring structure between steps may be applied to a step formed by an electronic component provided on the mounting surface or a step formed by an elevated wiring line formed on the mounting surface.

In the embodiment, each step portion has a single step. However, the step portion may have a plurality of steps or a step having a wall-like shape formed on a planar surface in a projected manner. In any case, the wiring structure between steps is applied to a region including a step to which droplets are hardly provided, so that the even slope is formed in the region. As a result, it is possible to form the wiring line having mechanically and electrically high reliability on the slope. Even in a case where semiconductor chips are stacked in a manner offsetting from each other for higher integration, the wiring structure between steps can be applied.

In the embodiment, the dots 20, the first slope 15, and the second slope 16 are formed of the insulating material. As such the insulating material, thermosetting resin such as epoxy resin, light curing resin such as acrylic resin, or a mixture of these is used. As long as the insulating material for forming the slope has an insulating property, polyimide resin, epoxy resin, polyester resin, phenol resin, fluorine resin, ultraviolet-curing resin, or visible light-curing resin may be used.

In the embodiment, the dots 20D, the first slope 15, and the second slope 16 are formed of the same insulating ink. However, the ink may have different compositions as long as it has an insulating property and the dried dots have liquid repellency with respect to the droplets for forming each slope. That is, the ink for forming the dots may contain a different insulating material or a different dispersion medium from the ink for forming each slope. This allows more freedom in selecting the ink used for the wiring method between steps.

In the embodiment, control of contact angle is not performed on the liquid repellent layer 14 and the dot 20D. However, the control of contact angle may be performed on the liquid repellent layer and the dots. For example, a lyophilic treatment may be performed on the dot 20D by irradiating the dot with ultraviolet rays. The wettability (hydrophilic property) of the dot 20D is increased so as to control a contact angle of the droplet with respect to the dot 20D. This enables the droplet to be easily wet and spread on the dot. As a result, the liquid layer can be widely formed without providing a number of droplets thereto. That is, enhancing the wettability enabling the height of the insulating slope to be controlled low.

Here, the control of contact angle is generally performed by irradiating the dot with ultraviolet rays. As the ultraviolet ray, excimer light (e.g., a wavelength 256 nm) or the like is employed. The lyophilic treatment may be performed by irradiating the dot with plasma. For example, by a plasma treatment using oxygen ($O_2$) as a process gas, the liquid repellency of the liquid repellent layer and dot may be increased. Further, the liquid affinity treatment may be performed by other known methods such as an ozone treatment, an oxidization treatment, or an alkali treatment. This allows more freedom in the liquid affinity treatment.

In the embodiment, the droplets of the insulating ink in an amount necessary to form the height of each of the first and second slopes 15 and 16 are continuously supplied. However, the droplets may be separately provided in multiple times to a predetermined region, or a large amount of the droplet may be provided in a single discharge. This allows more freedom in the method for providing the droplets in the method for forming wiring between steps.

In the method above, the liquid repellent layer 14 is formed, for example, by the inkjet method in a manner such that the liquid repellent ink is spread entirely on the electronic apparatus 10. The liquid repellent layer 14 may be formed by other methods, such as a dispenser method or a spin coating method, as long as the liquid repellent layer is entirely formed on the top surface of the electronic apparatus 10. This allows more freedom in the method for forming the liquid repellent layer, and the method for forming a semiconductor device can be used for various purposes.

In the embodiment, the liquid repellent layer 14 is formed of the droplets, i.e., a liquid phase. However, the phase is not limited to this. The liquid repellent layer may be formed of a gaseous phase. Further, the liquid repellent layer may be formed by plasma irradiation at normal pressure. The type of gas used for this plasma treatment is selected, for example, depending on the surface material of the substrate. For example, fluorocarbon gases such as tetrafluoromethane, perfluorohexane, and perfluorodecane can be used as a treatment gas. In this case, a liquid repellent, fluoride polymerized film can be formed as the liquid repellent layer.

The liquid repellent layer may be formed by bonding a film having liquid affinity, such as a polyimide film processed with tetrafluoroethylene, on the top surface of the electric apparatus 10. In the embodiment, the liquid repellent layer 14 is formed entirely on the top surface of the electronic apparatus 10. However, the liquid repellent layer may be formed only on a necessary area on the top surface of the electronic apparatus 10. This allows more freedom in embodiments of the method for forming the liquid repellent layer.

In the embodiment, the first electrode pads BP are arranged along one side of the mounting surface 11a of the mounting surface 11. However, the first electrode pads BP may be arranged in a plurality of sides of the mounting surface 11a, for example.

In the embodiment, the first chip 12, serving as an active component, is provided to the mounting substrate 11. However, the first chip is not limited to this. The first chip may be a passive component such as resistors and capacitors as long as it can be mounted by what is called as a face-up method, such as the first chip is mounted to the mounting surface in a manner such that a side opposite to the pad forming surface, on which the second electrode pads are formed, faces the mounting surface 11a.

In the embodiment, the second electrode pads P of the first chip 12 are arranged along one side of the pad forming surface 12a. However, the second electrode pads may be formed along a plurality of sides of the pad forming surface or only one of the second electrode pads may be formed, for example, in the same manner as the first electrode pads of the mounting substrate 11.

In the embodiment, the second chip 13, serving as an active component, is provided on the first chip 12. However, the second chip is not limited to this. The second chip 13 may be a passive component such as resistors and capacitors as long as it can be mounted by what is called as a face-up method, such as the second chip is mounted to the first chip in a manner such that a side opposite to the pad forming surface, on which the second electrode pads are formed, faces the pad forming surface of the first chip.

In the embodiment, the second electrode pads P of the second chip 13 are arranged along one side of the pad forming surface 13a. However, the second electrode pads may be formed along a plurality of sides of the pad forming surface or only one of the second electrode pads P may be formed, for example, in the same manner of the second electrode pads of the first chip.

The entire disclosure of Japanese Patent Application No. 2008-302459, filed Nov. 27, 2008 is expressly incorporated by reference herein.

What is claimed is:

1. A wiring method between steps in which a step portion is covered by an insulating slope formed by providing and drying droplets of an insulating ink in which an insulating material is dispersed in a dispersion medium and a wiring line formed by drying and firing provided droplets of a conductive ink in which a conductive material is dispersed in a dispersion medium is laid out between the steps and passes on a top surface of the insulating slope, the method comprising:
    covering a surface including the step portion where the wiring line to be laid out by a liquid repellent layer formed of a liquid material repelling the dispersion medium of the insulating ink;
    forming a plurality of dot lines including a plurality of dots by arranging a plurality of droplets of a resin ink including a resin material on a surface of the liquid repellent layer so as not to contact with each other in a region partitioned by a side serving as a start point and a side serving as an end point in a direction in which the wiring line is laid out, and by hardening the arranged droplets; and
    drying droplets of the insulating ink provided to the step portion so as to connect the dot lines,
wherein the wiring line between the steps is laid out so as to pass on a top surface of the insulating slope.

2. The wiring method between steps according to claim 1, an interval between the dots adjacent to each other in each of the dot lines is smaller than a landed diameter of each of the droplets of the insulating ink.

3. The wiring method between steps according to claim 1, wherein the insulating ink is provided by continuously discharging the droplets in an amount necessary to form a height of the insulating slope.

4. The wiring method between steps according to claim 1, further comprising performing a liquid affinity treatment to each of the dot lines so as to control a contact angle of the insulating ink with respect to the dot line prior to drying the provided droplets of the insulating ink.

5. The wiring method between steps according to claim 1, wherein the resin ink is composed of the same material as the insulating ink.

6. The wiring method between steps according to claim 1, wherein the wiring line is laid out on a plurality of semiconductor chips stacked in a manner offsetting from each other.

* * * * *